United States Patent
Khong et al.

(10) Patent No.: US 8,555,217 B1
(45) Date of Patent: Oct. 8, 2013

(54) INTEGRATED CIRCUIT DESIGN SOFTWARE WITH CROSS PROBING BETWEEN TOOL GRAPHICAL USER INTERFACES (GUIS)

(75) Inventors: James Khong, San Jose, CA (US); Xiaoming Ma, San Jose, CA (US); Justin Wu, Shanghai (CN)

(73) Assignee: Lattice Semiconductor Corporation, Hillsboro, OR (US)

( * ) Notice: Subject to any disclaimer, the term of this patent is extended or adjusted under 35 U.S.C. 154(b) by 189 days.

(21) Appl. No.: 13/164,108

(22) Filed: Jun. 20, 2011

(51) Int. Cl.
- *G06F 17/50* (2006.01)
- *G06T 1/00* (2006.01)
- *G06F 13/14* (2006.01)
- *G06F 3/00* (2006.01)
- *G06F 9/44* (2006.01)

(52) U.S. Cl.
USPC ........... 716/100; 716/102; 716/110; 716/111; 716/113; 716/139; 719/313; 719/315; 717/114; 717/116; 717/120; 715/762; 345/501; 345/519; 345/520; 345/522

(58) Field of Classification Search
USPC .................. 719/313, 315; 717/114, 116, 120; 715/762; 716/100, 102, 110–111, 113, 716/139; 345/501, 519–520, 522
See application file for complete search history.

(56) References Cited

U.S. PATENT DOCUMENTS

| | | | |
|---|---|---|---|
| 6,260,182 B1 | 7/2001 | Mohan et al. | |
| 6,401,230 B1 * | 6/2002 | Ahanessians et al. | 716/102 |
| 6,629,310 B1 * | 9/2003 | Wong-Lam et al. | 716/117 |
| 6,636,242 B2 * | 10/2003 | Bowman-Amuah | 715/764 |
| 6,675,230 B1 * | 1/2004 | Lewallen | 719/328 |
| 6,691,301 B2 * | 2/2004 | Bowen | 717/114 |
| 6,918,096 B2 * | 7/2005 | Hugh | 715/854 |
| 7,475,000 B2 * | 1/2009 | Cook et al. | 703/14 |
| 7,562,126 B2 | 7/2009 | Brunet et al. | |
| 7,590,951 B1 * | 9/2009 | Bell et al. | 716/131 |
| 7,761,842 B2 * | 7/2010 | Udler | 717/106 |
| 7,971,147 B2 * | 6/2011 | Subbarao et al. | 715/762 |
| 7,992,119 B1 * | 8/2011 | Iotov et al. | 716/119 |
| 8,028,258 B1 * | 9/2011 | Ogami et al. | 716/110 |
| 8,237,940 B2 * | 8/2012 | Conescu et al. | 358/1.13 |
| 8,261,236 B2 * | 9/2012 | Wijenayake et al. | 717/120 |
| 2004/0098689 A1 * | 5/2004 | Weed | 716/11 |
| 2004/0225992 A1 * | 11/2004 | Sanchez et al. | 716/16 |
| 2005/0097574 A1 * | 5/2005 | Morrison et al. | 719/328 |
| 2005/0108650 A1 * | 5/2005 | Muehlhausen | 715/760 |
| 2005/0268269 A1 * | 12/2005 | Coiley | 716/11 |
| 2006/0101368 A1 * | 5/2006 | Kesarwani et al. | 716/11 |
| 2006/0206870 A1 * | 9/2006 | Moulden et al. | 717/124 |
| 2007/0044086 A1 * | 2/2007 | Sampath | 717/168 |
| 2007/0250800 A1 * | 10/2007 | Keswick | 716/8 |
| 2008/0005713 A1 * | 1/2008 | Singh et al. | 716/11 |
| 2008/0244471 A1 * | 10/2008 | Killian et al. | 716/1 |

(Continued)

*Primary Examiner* — Stacy Whitmore (57) ABSTRACT

In one embodiment, an integrated circuit design tool is provided that includes a main window graphical user interface (GUI) and several tool GUIs. Cross probing of features from a source tool GUI to a target tool GUI occurs by the source tool GUI transmitting a probe request to the main window GUI; wherein the probe request identifies one or more cross-probed features for the target tool GUI. In response, the main window GUI commands a plug-in installation of the target tool GUI if the target tool GUI has not yet been instantiated. The main window GUI transmits a notification of the probe request to the target tool GUI. In response, the target tool GUI displays the cross-probed features.

20 Claims, 7 Drawing Sheets

(56) References Cited

U.S. PATENT DOCUMENTS

| | | | |
|---|---|---|---|
| 2008/0276221 A1* | 11/2008 | Lev et al. | 717/120 |
| 2009/0024937 A1* | 1/2009 | Lauff et al. | 715/762 |
| 2009/0064002 A1* | 3/2009 | Katsumata et al. | 715/762 |
| 2010/0146482 A1* | 6/2010 | Holtz et al. | 717/116 |
| 2010/0275173 A1* | 10/2010 | McDonald et al. | 716/11 |
| 2011/0225565 A1* | 9/2011 | van Velzen et al. | 717/114 |
| 2012/0317504 A1* | 12/2012 | Patel et al. | 715/762 |

\* cited by examiner

INTEGRATED CIRCUIT DESIGN SOFTWARE WITH CROSS PROBING BETWEEN TOOL GRAPHICAL USER INTERFACES (GUIS)

TECHNICAL FIELD

The present invention relates generally to integrated circuit design software and, more particularly, to design software architectures that enable cross probing of features between tool graphical user interfaces.

BACKGROUND

Certain integrated circuits such as programmable logic devices (PLDs) require configuration by the user before normal operation. Various programming systems exist that enable a user to shift in configuration data into the PLD to effect a desired logical function. There are corresponding types of elements or components that are configured by the resulting stored configuration data within the PLD. The primary component being configured may be referred to as the programmable fabric—in the case of a field programmable gate array (FPGA), the programmable fabric includes a plurality of lookup-table-based logic blocks as well as an associated routing structure. The configuration data for the programmable fabric is typically stored in a volatile FPGA memory (SRAM) and is shifted into the device through a dedicated data shift register (DSR).

The configuration process typically starts with the user translating the desired logical function into a hardware description language (HDL) on the programming system, which is typically a PC configured with the appropriate programming software. The programming PC, through its associated software, translates the user's HDL into a netlist. This netlist is then mapped by the programming PC to the resources corresponding to the particular type of PLD being configured such as a particular field programmable gate array (FPGA). The programming system can then perform a route-and-place routine in which the logic elements from the user's design are assigned to corresponding resources within the FPGA being programmed. The resulting mapping is fine-tuned and debugged during a simulation stage. Once the design is deemed satisfactory, a corresponding bitstream is generated for downloading into the FPGA A user interacts with the PLD programming software through a main graphical user interface (GUI). The design software process also uses a number of graphical user interface (GUI) tools that interface with the main GUI. For example, a floorplan view tool allows the designer to view design placement and edit placement constraints. A package view tool provides a graphical assignment of signals to I/O pins. A physical view tool illustrates the physical routing of paths to provide a more detailed understanding of timing issues. Other common tools include a hardware debugger and a power calculator.

A common feature of a tool graphical user interface is the ability to cross probe to other tool graphical user interfaces. For example, a user may select a feature such as an input/output pin in a first tool GUI (denoted as a source tool GUI) and observe this same feature selected in one or more of the remaining tool GUIs (denoted as the target tool GUI(s)). A conventional approach to enable cross probing is the use of dedicated function calls between the source tool GUI and the one or more target tool GUIs. But such a methodology requires a specific handshaking protocol between the tools that is inefficient. Moreover, the handshaking becomes unmanageable as the number of target tool GUIs is increased from one target tool GUI to many target tool GUIs.

Accordingly, there is a need in the art for improved software architectures that simplify the cross probing process.

SUMMARY

In accordance with a first embodiment, a method is provided that includes: transmitting a probe request from a source tool graphical user interface (GUI) to a main window GUI for an integrated circuit design tool; wherein the probe request identifies one or more cross-probed features for a target tool GUI; at the main window GUI, commanding a plug-in installation of the target tool GUI if the target tool GUI has not yet been instantiated; transmitting from the main window GUI a notification of the probe request to the target tool GUI; and displaying the one or more cross-probed features at the target tool GUI responsive to the notification.

In accordance with a second embodiment, a non-transitory computer readable medium containing instructions for execution by a processor to implement a programmable logic device design method is provided that includes: computer readable program instructions for transmitting a cross probe request from a source tool graphical user interface (GUI) to a main window GUI for an integrated circuit design tool, wherein the probe request identifies one or more cross-probed features for a target tool GUI; computer readable program instructions for commanding a plug-in installation of the target tool GUI if the target tool GUI has not yet been instantiated by the programmable logic design tool; computer readable program instructions for transmitting from the main window GUI a notification of the probe request to the target tool GUI; and computer readable program instructions for displaying the cross-probed features at the target tool GUI responsive to the notification.

In accordance with a third embodiment, a system for configuring an integrated circuit is provided that includes: a display; a memory for storing instructions; and a processor configured to retrieve and execute instructions from the memory, wherein the stored instructions configure the processor to implement a main window GUI and a plurality of tool GUIs on the display, the processor being configured to: transmit a cross probe request from a source tool graphical user interface (GUI) to a main window GUI for an integrated circuit design tool, wherein the probe request identifies one or more cross-probed features for a target tool GUI; at the main window GUI, command a plug-in installation of the target tool GUI if the target tool GUI has not yet been instantiated; transmit from the main window GUI a notification of the probe request to the target tool GUI; and display the one or more cross-probed features at the target tool GUI responsive to the notification.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
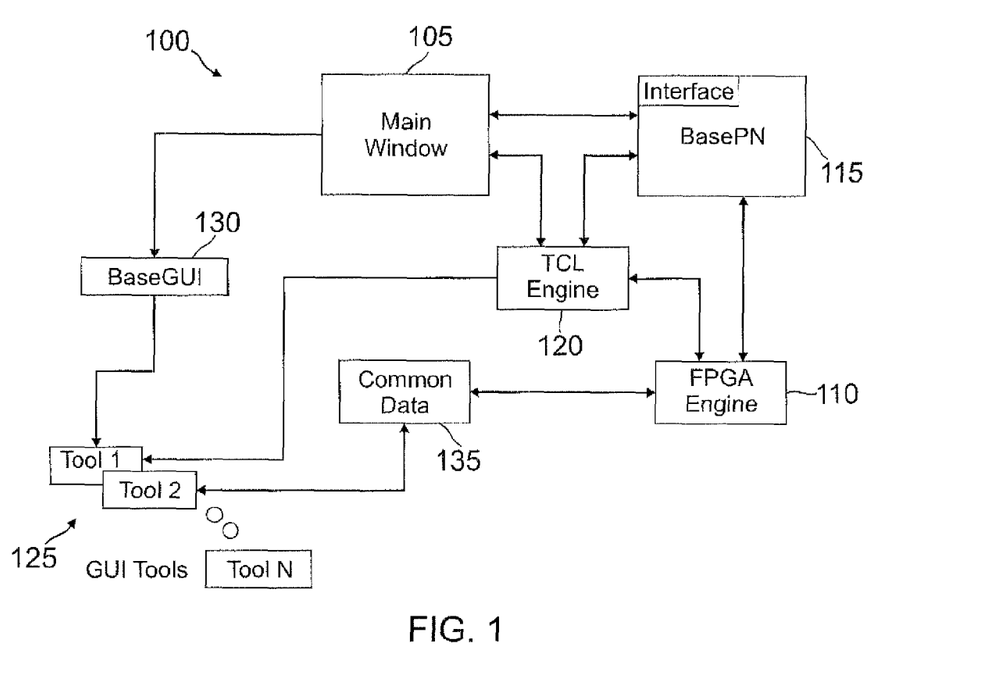
FIG. 1 is a block diagram for an example PLD design software architecture.

An integrated circuit design software architecture is disclosed that allows multiple plug-in tool graphical user interfaces (GUIs) to communicate effectively and efficiently. No dedicated function calls are necessary when cross probing from one tool graphical user interface (GUI) to other tool GUIs. This architecture will be described with regard to field programmable gate array (FPGA) configuration but it will be appreciated that the concepts disclosed herein are readily applicable to other types of integrated circuits such as the configuration of complex gate array devices. Turning now to the drawings, an FPGA design software architecture 100 is illustrated in FIG. 1. A user will typically interface with software 100 through a main window GUI 105.

An FPGA engine program module 110 implements the FPGA core engines that effect the various process flow stages as a user works on a particular design. For example, FPGA engine program module 110 implements a map-and-place flow stage, a database, timing analysis, and other process flow stages as necessary. Main window GUI 105 interfaces with FPGA engine 110 through a project navigator (PN) interface program and GUI interface module 115. A script language engine such as a tool command language (TCL) engine program module 120 supports main window GUI 105, FPGA engine 110, PN interface module 115, as well as a suite of FPGA design tool GUIs 125 ranging from a tool 1 to a tool N. For example, tool GUI suite 125 can include a spreadsheet view, a package view, a floorplan view, a physical view, a timing analysis view, and other suitable FPGA design tool GUIs. Each tool GUI 125 is an instantiation of a tool GUI class denoted as BaseGUI 130. BaseGUI 130 thus provides a standardized interface between main window GUI 105 and tool GUIs 125. A common data base module 135 stores project data such as the device data, a user's design data, and a user's constraint data. GUIs 130, 125, and 105 may be implemented using an appropriate GUI development toolkit such as Qt available from Qt Development Frameworks of Oslo, Norway. The remaining modules may be implemented in an appropriate object-oriented programming language such as C++.

To enable convenient and efficient integration of tool GUIs 125 with main window GUI 105, each tool GUI 125 is integrated as a plug-in module or tool. In this fashion, a software developer may design, implement, test, and debug a given tool in its own isolated environment. Once the tool is deemed robust and ready for integration, the developer need merely copy the individual tool's dynamic linked library into the system running architecture 100. Because the tools are integrated as plug-in modules, the removal of a tool does not require a rebuild of main window GUI 105. Moreover, the user of plug-in technology simplifies build dependencies since there are no dependencies among the tools—they are all integrated at the same hierarchy level.

Figure 2:
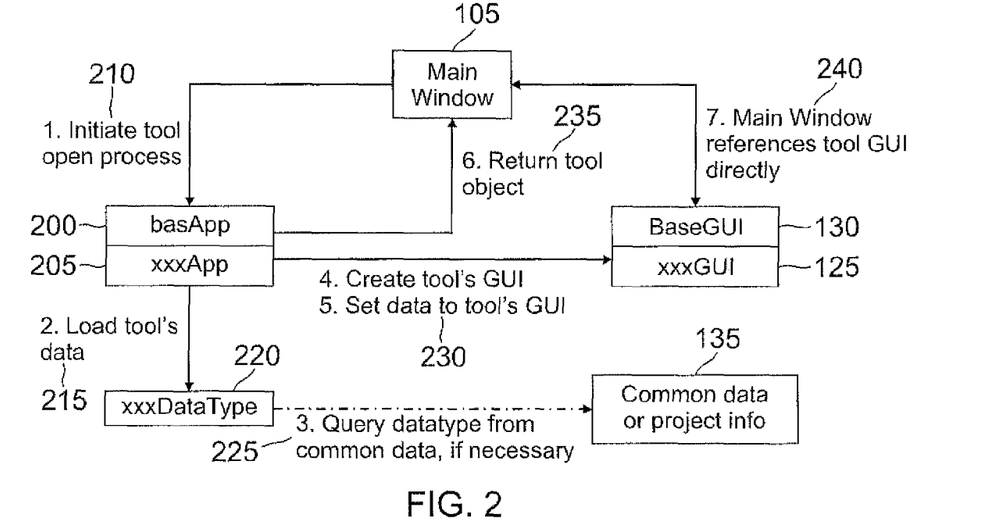
FIG. 2 is a process flow diagram for the installation of a plug-in tool GUI that operates through the main window GUI of FIG. 1.

FIG. 2 shows the process flow for the integration of a plug-in tool module with main window GUI 105. Each tool GUI 125 corresponds to its own plug-in program xxxApp 205, where "xxx" denotes a string that identifies the corresponding tool GUI. Each plug-in program is an instantiation of a plug-in program class denoted as basApp 200. Each plug-in tool thus has a unique name such as "xxxApp" module 205. Upon boot-up of the computer system running software architecture 100 (discussed further with regard to FIG. 9), main window GUI 105 searches for and loads all plug-in tools and their associated libraries in a plug-in directory by first initiating the plug-in process in a step 210. In a second step 215, xxxApp module 205 will load the tool's required data through an associated data type module (represented by xxxDataType 220). Just as with module 205, the "xxx" string for module 220 identifies the corresponding tool GUI. Module 220 then queries common data base module 135 in a step 225.

The xxxApp module 205 functions as an interface for main window GUI 105 to initiate the creation of tool GUI 125 (denoted as "xxxGUI" in FIG. 2 analogously to xxxApp). In addition, to minimize a load time of GUI tool 125, xxxApp module 205 may include just the minimum amount of information such as the tool's identity, display name, display icon, and its data-type dependencies for access to project data within common database 135. Moreover, xxxApp 205 may identify the tool's source file type and options. Note that single xxxApp module 205 may create multiple GUI tools 125. With regard to each tool creation, xxxApp module 205 creates tool GUI 125 in a step 230 and applies the data from step 215 to tool GUI 125. Having created tool GUI 125, xxxAPP module 205 can then return the corresponding tool object to main window GUI 105 in a step 235. Main window GUI 105 can then reference tool GUI 125 during normal operation in a step 240.

Figure 3:
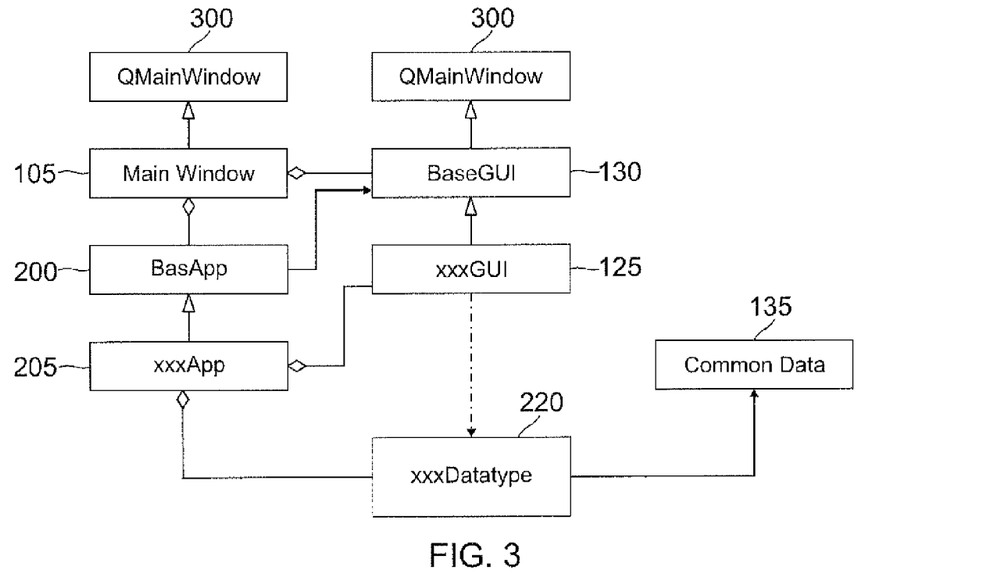
FIG. 3 is a class diagram for the software modules of FIG. 2.

In an object-oriented embodiment, the various software modules can be constructed in a class/sub-class hierarchy so that the sub-classes can benefit from the software concept of inheritance with regard to the parent class' properties. FIG. 3 illustrates an example class diagram accordingly. In this embodiment, the GUIs were implanted using the Qt language such that the highest class level is the QtGUI prototype class 300. Main window GUI 105 and base GUI 130 are both sub-classes of Qt GUI prototype class 300. Tool GUI 125 is in turn a sub-class of base GUI 130. Base App 200 has a many-to-one relationship to main window GUI 105. Similarly, base GUI 130 also has a many-to-one relationship to main window GUI 105. Module xxxApp 205 is a sub-class of base App 200. A data type 220 for data stored in common data base 135 has a one-to-many relationship to xxxAPP module 205. Similarly, tool GUI 125 also has a many-to-one relationship with xxxAPP module 205.

Figure 4:
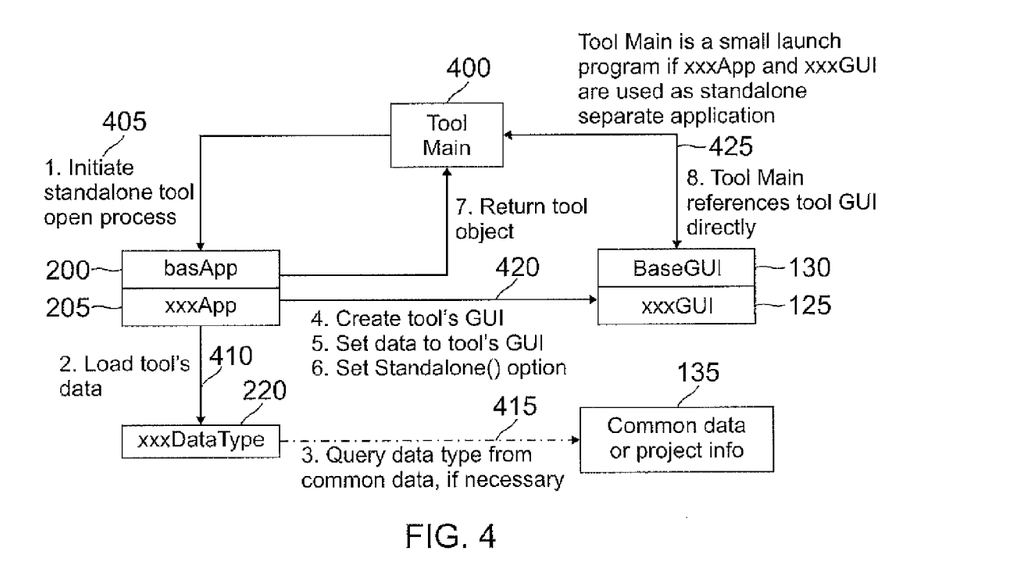
FIG. 4 is a process flow diagram for the installation of a standalone plug-in tool GUI.

There may be situations in which a user desires to operate a given tool such as the floorplan view, spreadsheet view, package view, etc. as a standalone application rather than operate the tool through the main window GUI. FIG. 4 illustrates the process flow for opening a standalone tool in which the main window GUI is replaced by a launch program denoted as tool main module 400. The process flow then closely resembles that discussed with regard to FIG. 2. For example, a step 405 in which tool main module 400 begins the open process by accessing xxxAPP 205 through base App 200 is analogous to step 210. Similarly, a step 410 that loads the tool's data according its data type 220 along with querying common database 135 in a step 415 are analogous to steps 215 and 225, respectively. A step 420 is analogous to step 230 except that the tool GUI 125 is notified that the standalone mode has been selected. Standalone operation may then proceed in a step 425.

Figure 5:
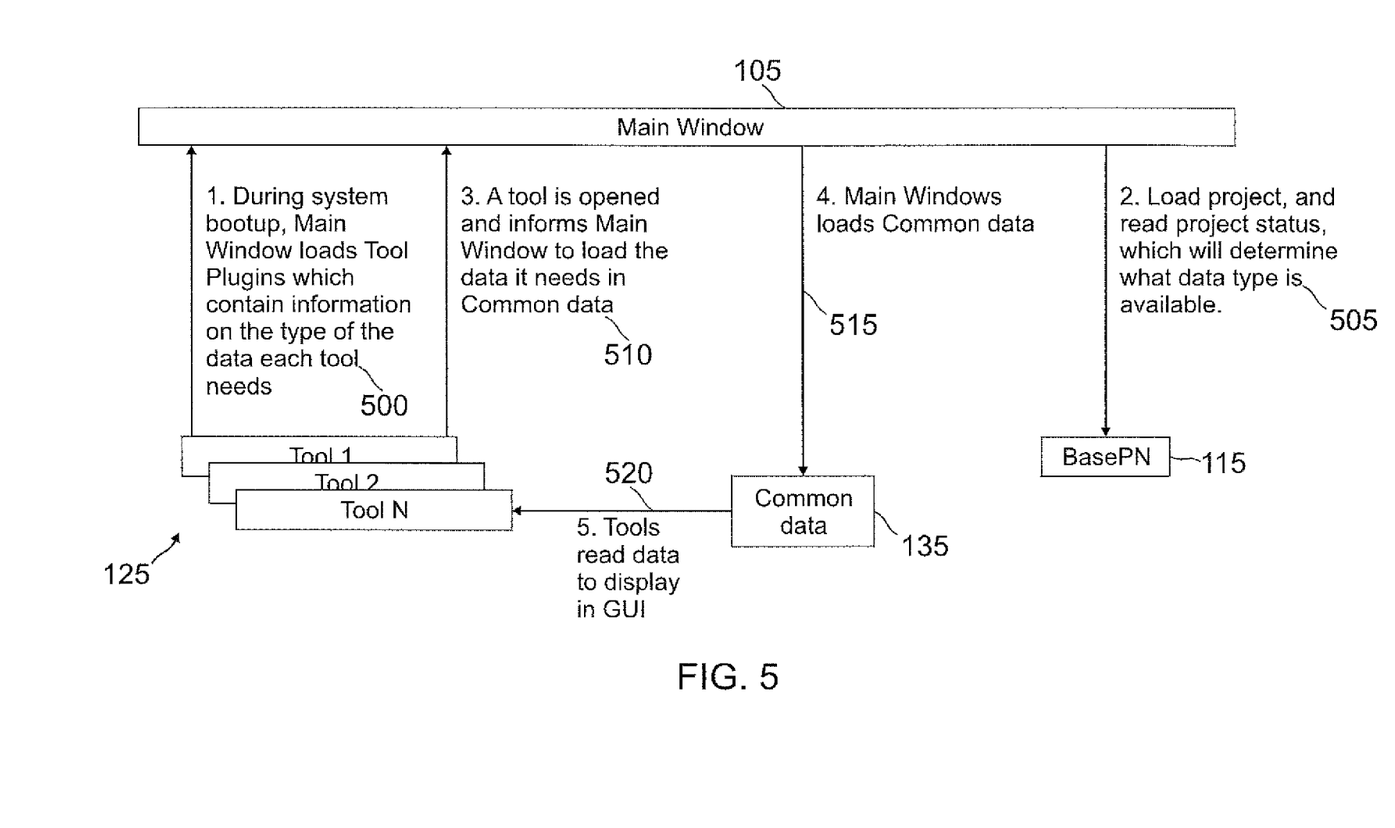
FIG. 5 is a process flow diagram for the main window GUI loading the appropriate tool data into the common database upon the plug-in installation of the tool GUIs.

The plug-in modularity of the tools provides a convenient communication interface between the main window GUI and the tool GUIs. In other words, the tool's data context sensitivity is automatically initialized as shown in the example process flow of FIG. 5. In a step 500, tool GUIs 125 are installed as plug-in modules as discussed with regard to FIG. 2. A user may then initiate an FPGA design project such that main window GUI 105 loads the project, reads project status, and determine what type of data type is available through project navigator module 115 in a step 505. A user may then open a desired tool GUI 125, which then informs main window GUI 105 of the data the tool GUI needs for operation in a step 510. Main window GUI 105 responds by loading the appropriate data into common database 135 in a step 515. Tool GUIs 125 may then read the loaded data in a step 520 so as to display the corresponding results to a user.

Figure 6:
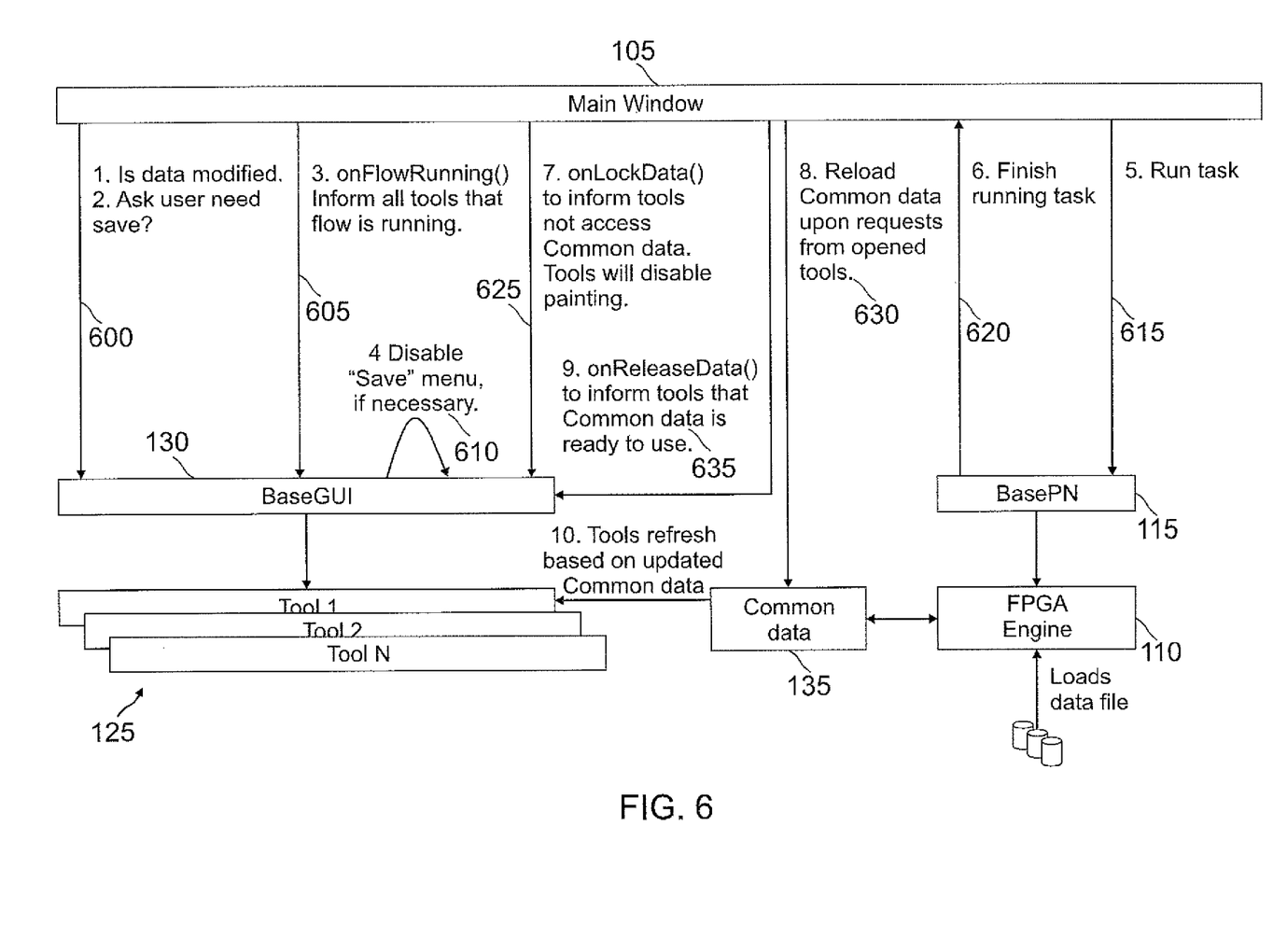
FIG. 6 is a process flow diagram for control of the tool GUIs during FPGA design state changes.

To prevent a tool from accessing invalid or non-updated data when FPGA processes are running in FPGA engine 110 (such as the route-and-place process), a tool GUI may be temporarily disabled according to the example process flow shown in FIG. 6. For example, a user may desire to start the place-and-route process such that main window GUI 105 first determines whether any of the common data was modified and ask the user through base GUI 130 if a save operation should be run accordingly in a step 600. Main window GUI 105 may then inform all tool GUIs 125 that an FPGA engine process is starting in a step 605. If necessary, any save menu in tool GUIs 125 is disabled in a step 610. Main window GUI 105 may then instruct FPGA engine 110 to perform the desired task through project navigator module 115 in a step 615. Project navigator 115 may inform main window GUI 105 that the task is completed in a step 620. Main window 105 informs tool GUIs 125 not to access common database 135 in a step 625 so that main window 105 can refresh common database 125 with the appropriate tool data in a step 630. With the data refreshed, main window 105 may then inform tool GUIs 125 that the common database 135 is ready for use such that normal tool operation may resume in a step 635.

Figure 7:
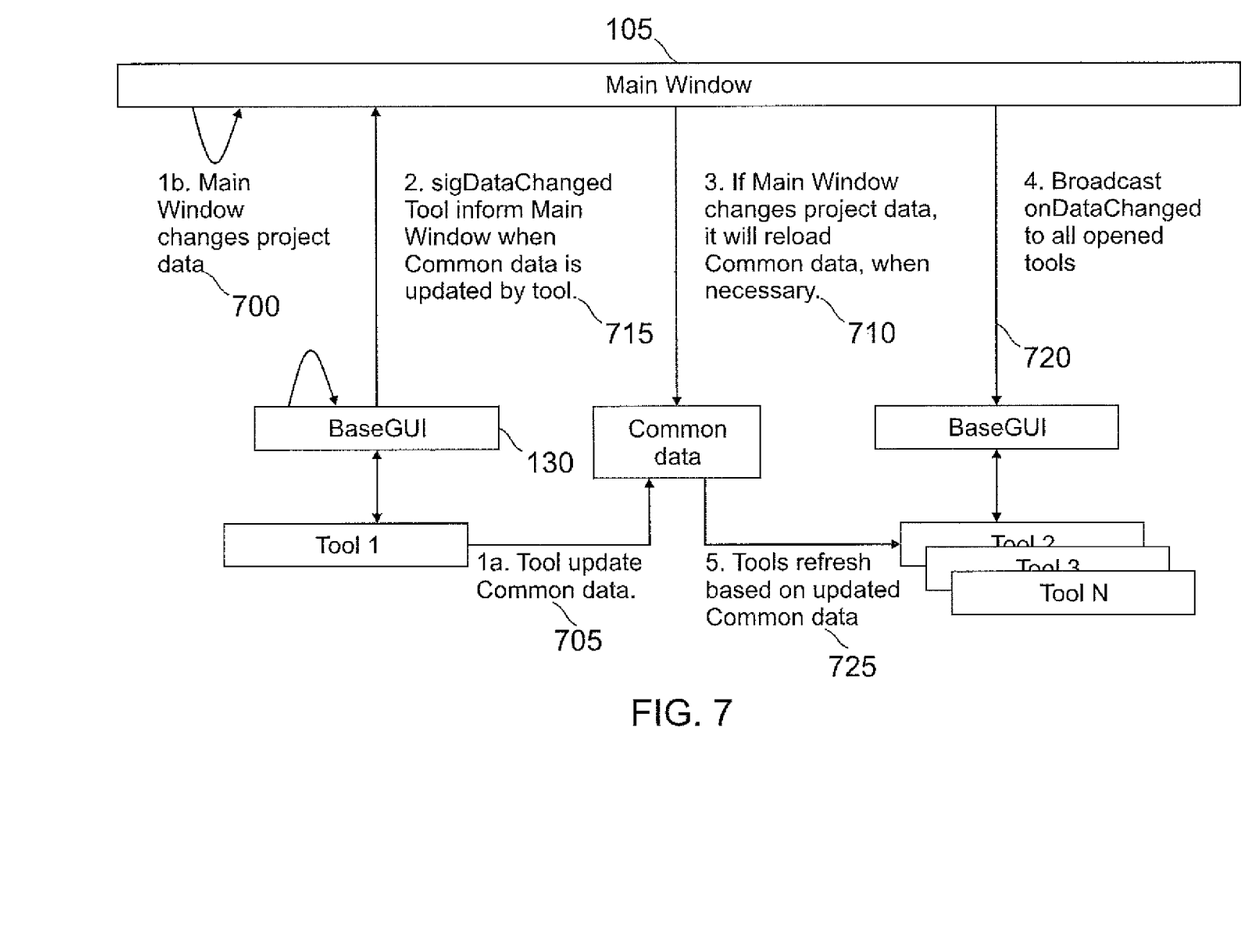
FIG. 7 is a process flow diagram for control of the tool GUIs if any of the tools update the common database or if the project information is changed through the main window GUI.

A tool may also change the tool data stored in common database 135. Alternatively, a user may alter the project data (such as changing a timing restraint, etc) through main window GUI 105. The plug-in modularity discussed with regard to FIGS. 2 and 5 advantageously accommodates these changes as shown in FIG. 7. A step 700 corresponds to a main window project data change whereas a step 705 corresponds to a tool changing tool data within common database 135. In case of the change occurring through step 700, main window GUI 105 will reload common database 135 with the appropriate modified tool data if necessary in a step 710. Similarly, if the change occurred through step 705, base GUI 130 informs main window GUI 105 of the common database 135 update in a step 715. Regardless of whether the change is due to step 700 or step 705, main window 105 may then broadcast the data change status to all opened tool GUIs in a step 720. Responsive to this broadcast, the opened tool GUIs then refresh their status based on the updated common database 135 in a step 725.

Figure 8:
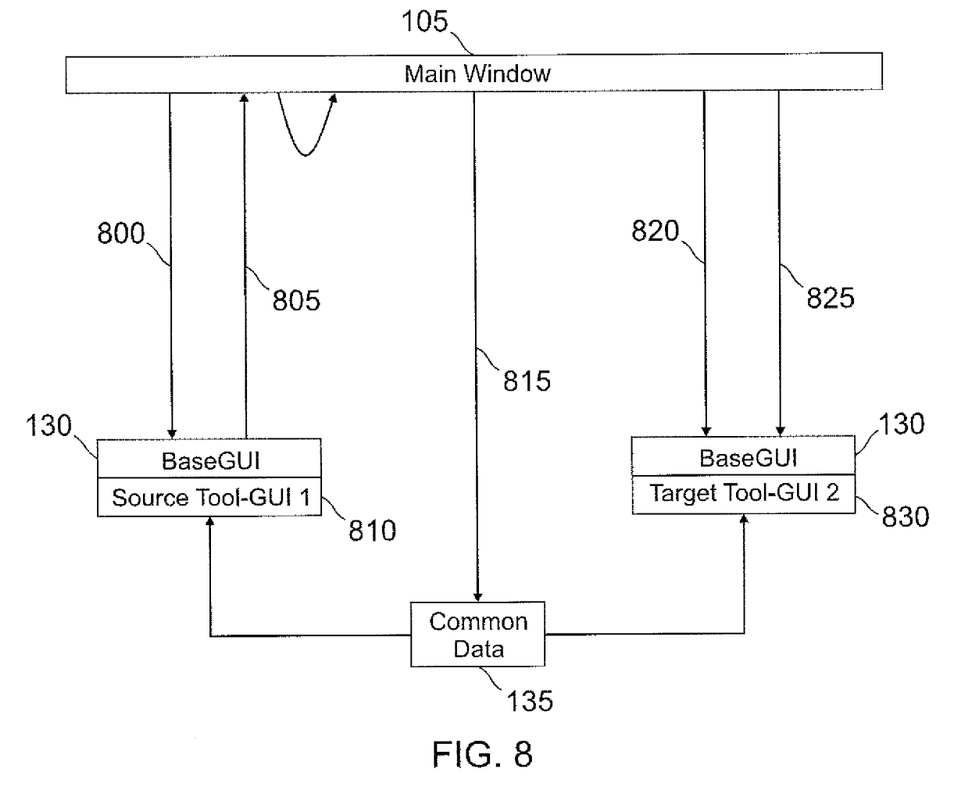
FIG. 8 is a process flow diagram for cross-probing between a source tool and a target tool.

The modularity of plug-in installation for the tools also provides an advantageous protocol for cross-probing between tools. In cross-probing, a user selects a feature shown in a first tool (denoted as the source tool) and wishes to see the same feature selected in another tool (denoted as the target tool). For example, a user may select a certain pin while using the source tool. Through cross-probing, the user may then see this same pin selected in a target tool (or target tools). In one embodiment, the cross-probing is performed using the Qt signal-slot protocol. An example process flow for such cross-probing is shown in FIG. 8. In an initial step 800, a source tool is created through the plug-in process discussed above with regard to FIGS. 2 and 4. Should a user select a feature through the source tool GUI (for example, an I/O), cross-probing allows the user to see that same feature in the target tool GUI. Thus, the source and target tool GUIs are simply instantiations of the tool GUIs 125 discussed above. Upon selection of the feature by the user, a source tool GUI 810 transmits a Qt Signal 805 to main window GUI 105. Qt Signal 805 identifies the target tool, the source tool(s), as well as the cross-probed features. If the target tool has not yet been created, main window GUI 105 will perform a plug-in installation 820 for the target tool accordingly. If the cross-probed features are not supported by the target tool, the cross probe request is disabled. Main window GUI 105 identifies and instantiates a target tool GUI 830, which will then respond on the cross-probed features request from the source tool GUI 810. Should the necessary target tool data not be loaded into common database 135, main window GUI 105 will command 815 the loading of this data through the project navigator module (not shown but discussed above) into common database 135. With the target tool created and the necessary data available, main window GUI 105 may then issue a Qt Slot 825 to target tool GUI 830 such that target tool GUI 830 displays the cross-probed features. Qt slot 825 identifies target tool GUI 830 in addition to the cross-probed features.

Figure 9:
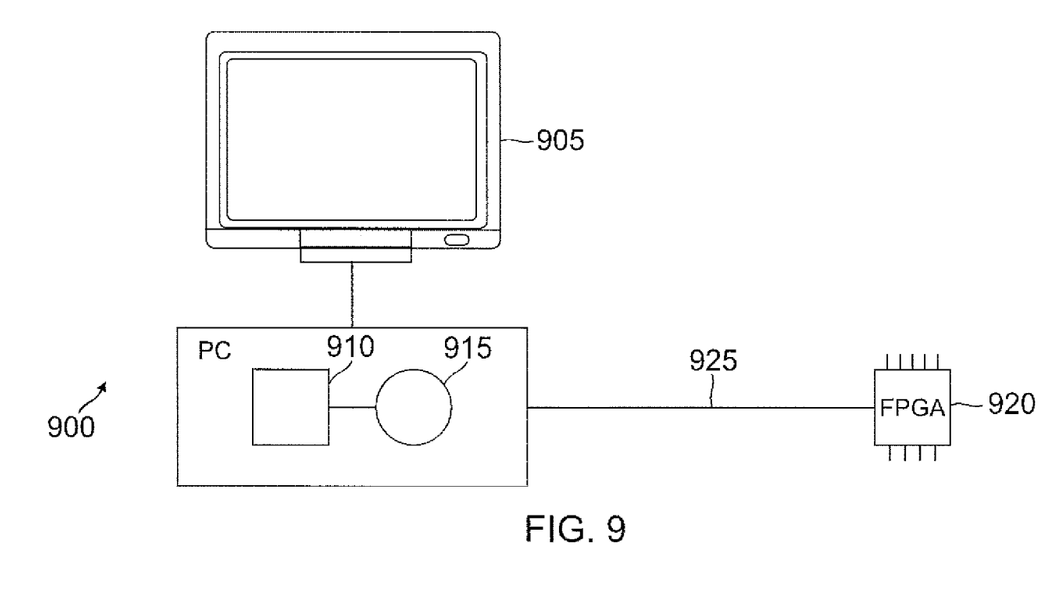
FIG. 9 illustrates a computer system for configuring a programmable logic device (PLD) according to the process flows of FIGS. 1-8.

A computer system 900 that includes a display 905 for displaying the main window GUI and the tool GUIs is shown in FIG. 9. System 900 includes a processor 910 for implementing instructions stored on a non-transitory computer readable medium 915. These instructions create software architecture 100 discussed with regard to FIG. 1. Upon completion of the all the necessary process flows for configuration of an FPGA 920, system 900 creates a configuration bitstream 925 that is downloaded into the FPGA to complete the configuration process.

The above-described embodiments of the present invention are representative of many possible embodiments. It will thus be apparent to those skilled in the art that various changes and modifications may be made to what has been disclosed without departing from this invention. The appended claims encompass all such changes and modifications as fall within the true spirit and scope of this invention.

We claim:

1. A method, comprising:
transmitting a cross probe request from a source tool graphical user interface (GUI) to a main window GUI for an integrated circuit design tool, wherein the cross probe request identifies one or more cross-probed features for a target tool GUI;

at the main window GUI, commanding a plug-in installation of the target tool GUI if the target tool GUI has not yet been instantiated;

transmitting from the main window GUI a notification of the probe request to the target tool GUI; and displaying the identified one or more cross-probed features in the target tool GUI responsive to the notification.

2. The method of claim 1, wherein commanding the plug-in installation of the target tool GUI comprises:

instantiating a first object in a plug-in management module class to manage the plug-in of the target tool GUI;

from the main window GUI, initiating the first object to load data corresponding to the target tool GUI into a common database accessible to tool GUIs; and through the first object, instantiating the target tool GUI.

3. The method of claim 1, wherein the source and target tool GUIs are each selected from a group of tool GUIs consisting of a spreadsheet view GUI, a package view GUI, a floorplan view GUI, a physical view GUI, and a timing analysis view GUI.

4. The method of claim 1, wherein the source and target tool GUIs are instantiations of a tool GUI class.

5. The method of claim 4, wherein if the target tool GUI does not support the cross-probed features, the cross probe request is disabled.

6. The method of claim 1, wherein the cross probe request is a Qt signal in a QT signal/slot protocol.

7. The method of claim 6, wherein the Qt signal identifies the source and target tool GUIs.

8. The method of claim 1, wherein the notification from the main window GUI is a Qt slot in a Qt signal/slot protocol.

9. The method of claim 8, wherein Qt slot identifies the source tool GUI and the cross-probed features.

10. The method of claim 1, wherein the integrated circuit design tool is a field programmable gate array (FPGA) design tool.

11. The method of claim 1, wherein the target tool GUI comprises a plurality of target tool GUIs.

12. A non-transitory computer readable medium containing instructions for execution by a processor to implement an integrated circuit design method, comprising:

computer readable program instructions for transmitting a cross probe request from a source tool graphical user interface (GUI) to a main window GUI for an integrated circuit design tool, wherein the cross probe request identifies one or more cross-probed features for a target tool GUI;

computer readable program instructions for commanding a plug-in installation of the target tool GUI if the target tool GUI has not yet been instantiated by the programmable logic design tool;

computer readable program instructions for transmitting from the main window GUI a notification of the probe request to the target tool GUI; and computer readable program instructions for displaying the identified one or more cross-probed features at the target tool GUI responsive to the notification.

13. The non-transitory computer readable medium of claim 12, wherein the computer readable program instructions for commanding the plug-in installation includes:

computer readable program instructions for instantiating a first object in a plug-in management module class to manage the plug-in of the target tool GUI; and computer readable program instructions for initiating the first object to load data corresponding to the target tool GUI into a common database accessible to the target tool GUI and instantiating the target tool GUI through the first object.

14. The non-transitory computer readable medium of claim 13, wherein the source and target tool GUIs are each selected from a group of tool GUIs consisting of a spreadsheet view GUI, a package view GUI, a floorplan view GUI, a physical view GUI, and a timing analysis view GUI.

15. The non-transitory computer readable medium of claim 13, further comprising computer readable program instructions for determining whether the target tool GUI supports the cross-probed features.

16. A system for configuring an integrated circuit, comprising:

a display;

a memory for storing instructions; and a processor configured to retrieve and execute instructions from the memory, wherein the stored instructions configure the processor to implement a main window GUI and a plurality of tool GUIs on the display, the processor being configured to:

transmit a cross probe request from a source tool graphical user interface (GUI) to a main window GUI for an integrated circuit design tool, wherein the cross probe request identifies one or more cross-probed features for a target tool GUI;

at the main window GUI, command a plug-in installation of the target tool GUI if the target tool GUI has not yet been instantiated;

transmit from the main window GUI a notification of the probe request to the target tool GUI; and display the one or more cross-probed features at the target tool GUI responsive to the notification.

17. The system of claim 16, wherein the source and target tool GUIs are each selected from a group of tool GUIs consisting of a spreadsheet view GUI, a package view GUI, a floorplan view GUI, a physical view GUI, and a timing analysis view GUI.

18. The system of claim 16, wherein the processor is further configured to:

instantiate a first object in a plug-in management module class to manage the plug-in of the target tool GUI;

from the main window GUI, initiate the first object to load data corresponding to the target tool GUI into a common database accessible to the tool GUIs; and through the first object, instantiate the target tool GUI.

19. The system of claim 16, wherein the cross probe request is a Qt signal in a QT signal/slot protocol.

20. The system of claim 16, wherein the notification from the main window GUI is a Qt slot in a Qt signal/slot protocol.

* * * * *